(12) United States Patent
Shin

(10) Patent No.: US 9,053,792 B2
(45) Date of Patent: Jun. 9, 2015

(54) SEMICONDUCTOR MEMORY DEVICE HAVING RAY DETECTOR, AND ELECTRONIC DEVICE INCLUDING THE SAME, AND OPERATING METHOD THEREOF

(71) Applicant: SK hynix Inc., Gyeonggi-do (KR)

(72) Inventor: Jin-Wook Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,795

(22) Filed: Dec. 15, 2013

(65) Prior Publication Data

US 2015/0098262 A1 Apr. 9, 2015

(30) Foreign Application Priority Data

Oct. 4, 2013 (KR) .................. 10-2013-0118517

(51) Int. Cl.
*G11C 13/04* (2006.01)

(52) U.S. Cl.
CPC .................. *G11C 13/04* (2013.01)

(58) Field of Classification Search
USPC ........................................ 365/108
See application file for complete search history.

(56) References Cited

U.S. PATENT DOCUMENTS

| 8,436,289 B1 * | 5/2013 | Hossain et al. ............ 250/214.1 |
| 2005/0192719 A1 * | 9/2005 | Sheikh et al. ................ 701/13 |
| 2008/0279334 A1 * | 11/2008 | Takenaka et al. ............ 378/116 |
| 2009/0057565 A1 * | 3/2009 | Hannah .................. 250/370.14 |
| 2014/0138555 A1 * | 5/2014 | Hannah ...................... 250/394 |

FOREIGN PATENT DOCUMENTS

KR 1020070036785 4/2007

* cited by examiner

*Primary Examiner* — Hoai V Ho
*Assistant Examiner* — Pablo Huerta
(74) *Attorney, Agent, or Firm* — IP & T Group LLP

(57) ABSTRACT

A semiconductor memory device includes a first memory region, a second memory region suitable for storing the same data as the first memory region, and a ray detection circuit suitable for detecting an incident ray to the first memory region, wherein a data stored in the second memory region is copied into the first memory region when the incident ray is detected.

11 Claims, 4 Drawing Sheets

SEMICONDUCTOR MEMORY DEVICE HAVING RAY DETECTOR, AND ELECTRONIC DEVICE INCLUDING THE SAME, AND OPERATING METHOD THEREOF

CROSS-REFERENCE TO RELATED APPLICATIONS

The present application claims priority of Korean Patent Application No. 10-2013-0118517, filed on Oct. 4, 2013, which is incorporated herein by reference in its entirety.

BACKGROUND

1. Field

Exemplary embodiments of the present invention relate to a semiconductor design technology, and more particularly, to an electronic device including a semiconductor device and a controller.

2. Description of the Related Art

A cosmic ray is a generic term for various kinds of particles and radioactive rays that may originate in the universe and fall to the earth and may have great energy.

The cosmic ray may influence a cell in a semiconductor device and distort data stored in the cell. An error caused by the distorted data is referred to as a soft error.

The soft error may be corrected by an error correction code (ECC) circuit. The ECC circuit generates a parity data based on an input data and perform error correction when the data is outputted. However, the ECC circuit may correct a limited number of soft error bits of the data so it may not correct data, soft error bits of which exceeds the limited number. Especially, under the circumstances of frequent occurrence of the cosmic ray, there may be a high probability that the number of oft error bits may exceed a number limited by the ECC circuit.

SUMMARY

An exemplary embodiment of the present invention is directed to an electronic device that is capable of correct the soft error due to the cosmic ray.

In accordance with an exemplary embodiment of the present invention, a semiconductor memory device may include a first memory region, a second memory region suitable for storing same data as the first memory region, and a ray detection circuit suitable for detecting an incident ray to the first memory region, wherein a data stored in the second memory region is copied into the first memory region when the incident ray is detected.

The ray detection circuit may include a plurality of ray detection units, and each of the plurality of ray detection units may include a crystal layer disposed over the first memory region and suitable for reflecting the incident ray, and a detector for detecting a reflected ray reflected by the crystal layer.

In accordance with an exemplary embodiment of the present invention, an electronic device may include a semiconductor device comprising first and second memory regions storing same data and suitable for generating a ray detection signal by detecting an incident ray to the first memory region, and a controller suitable for generating a control signal in response to the ray detection signal, wherein the semiconductor device copies a data stored in the second memory region into the first memory region in response to the control signal.

In accordance with an exemplary embodiment of the present invention, a method for correcting a data error of a semiconductor memory device may include storing same data into a first memory region and a second memory region, detecting an incident ray to the first memory region, and copying a data stored in the second memory region into the first memory region when the ray is detected.

When used in the hilly section or the universe where there are a lot of cosmic rays, the electronic device in accordance with various embodiments of the present invention may correct a plurality of error bits, the number of which may exceed a number limited by an ECC circuit.

DETAILED DESCRIPTION

Figure 1:
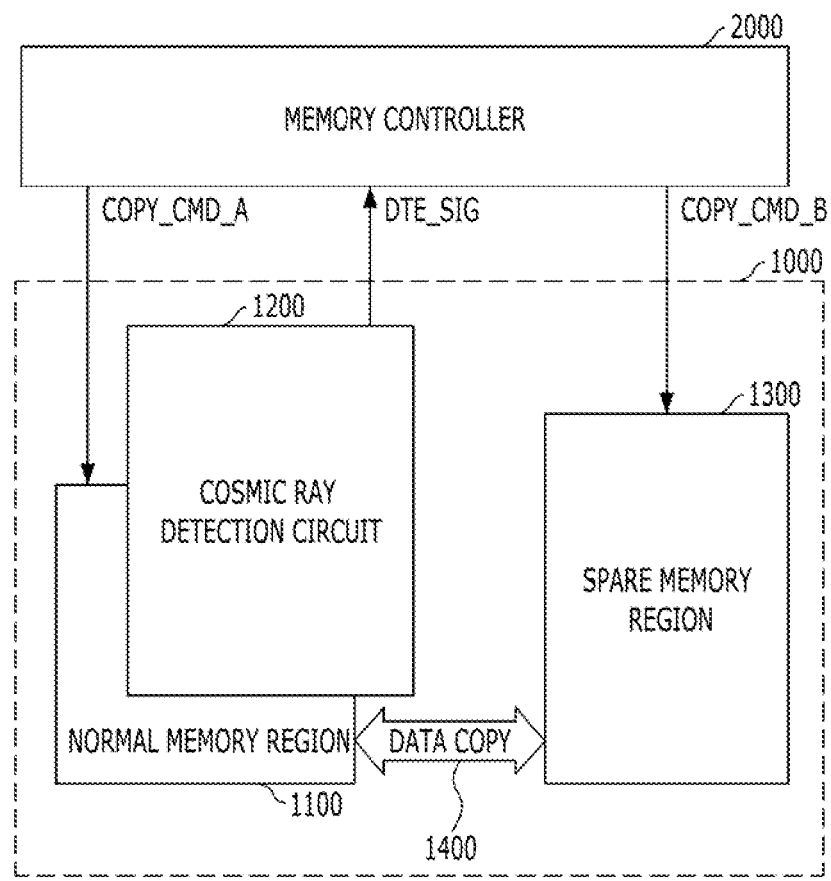
FIG. 1 is a block diagram illustrating an electronic device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure is interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIG. 1 is a block diagram illustrating an electronic device in accordance with an embodiment of the present invention. Referring to FIG. 1, the electronic device may include a semiconductor memory device 1000 and a memory controller 2000.

The semiconductor memory device 1000 may include a normal memory region 1100, a cosmic ray detection circuit 1200, and a spare memory region 1300. The normal memory region 1100 and the spare memory region 1300 may store the same data at a time of write operation. Detailed description about the normal memory region 1100 and the spare memory region 1300 will be made with reference to FIGS. 2 and 3.

The cosmic ray detection circuit 1200 may detect an incident ray, i.e., a cosmic ray to penetrate through the normal memory region 1100. The cosmic ray detection circuit 1200 may be disposed over the normal memory region 1100. The cosmic ray detection circuit 1200 may detect the cosmic ray before the cosmic ray penetrates through the normal memory region 1100 and transmit a cosmic ray detection signal DET_SIG to the memory controller 2000. Detailed description about the cosmic ray detection circuit 1200 will be made with reference to FIGS. 4 and 5.

The memory controller 2000 may receive the cosmic ray detection signal DET_SIG from the cosmic ray detection circuit 1200 and output a first control signal COPY_CMD_A and a second control signal COPY_CMD_B for correcting a data error caused by the cosmic ray. The memory controller 2000 may output the second control signal COPY_CMD_B to the spare memory region 1300. In response to the second control signal COPY_CMD_B, data stored in the spare memory region 1300 may be transmitted to the normal memory region 1100. In response to the first control signal COPY_CMD_A, the transmitted data is copied and applied to the normal memory region 1100.

In accordance with another embodiment of the present invention, one control signal may control both of the normal memory region 1100 and the spare memory region 1300 to copy data.

The normal memory region 1100 and the spare memory region 1300 that may receive the first control signal COPY_CMD_A and the second control signal COPY_CMD_B from the memory controller 2000 may correct the data error caused by the cosmic ray through data copy.

The data copy for data error correction may be performed through a data bus 1400 coupling the normal memory region 1100 and the spare memory region 1300.

The data error may be the soft error caused by data distortion because of penetration of the cosmic ray through the normal memory region 1100.

Figure 2:
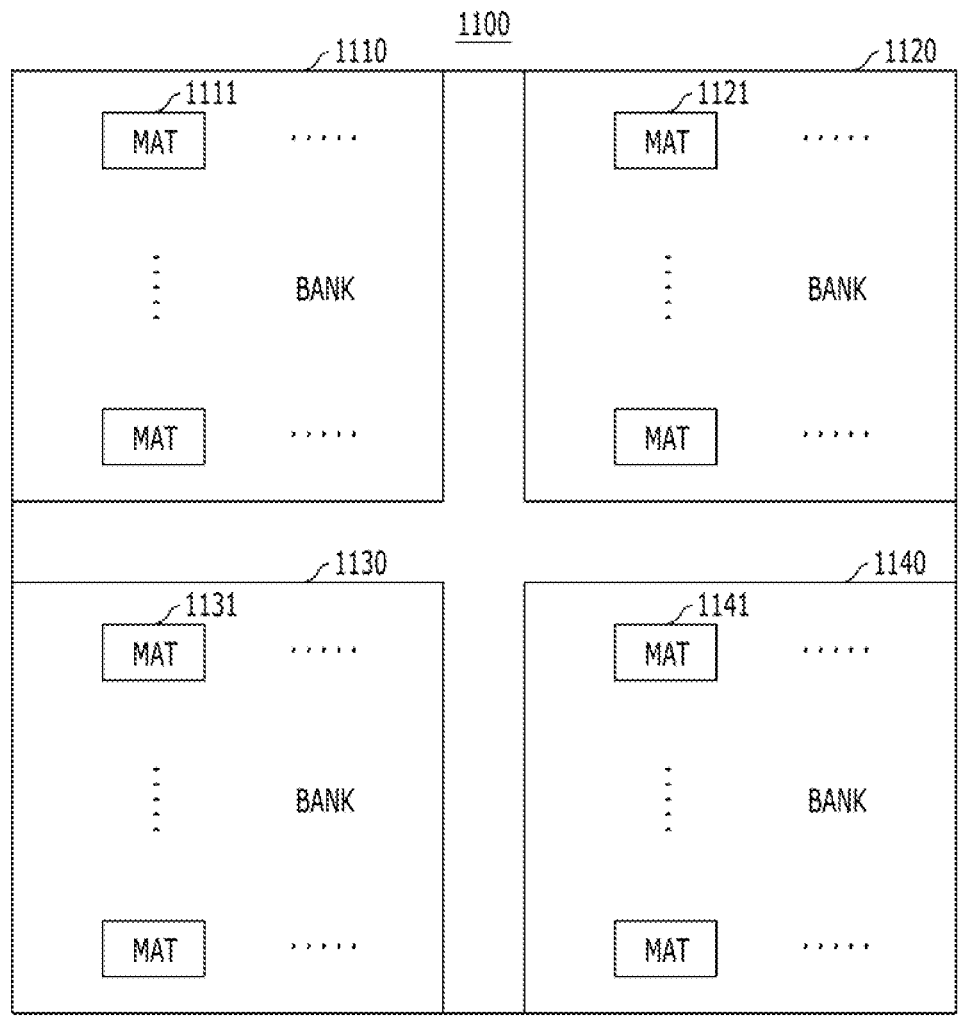
FIG. 2 is a black diagram illustrating a normal memory region shown in FIG. 1.

FIG. 2 is a block diagram illustrating the normal memory region 1100 shown in FIG. 1. Referring to FIG. 2, the normal memory region 1100 may be a memory cell array region comprising first to fourth memory banks 1110 to 1140. Description is made with reference to the first memory bank 1110 from the memory banks 1110 to 1140, as an example.

A MAT 1111 is a collection of unit cells, each of which is capable of storing 1 bit data. The unit cells in the MAT 1111 forms a matrix, which will be described with reference to FIG. 3. A plurality of MATS form a bank 1110 and a plurality of banks form a memory cell array.

FIG. 2 shows a memory cell array comprising 4 banks 1110 to 1140 but a memory cell array may comprise 8 or 16 memory banks.

The spare memory region 1300 may have the same structure as the normal memory region 1100 and store the same data as the normal memory region 1100.

Figure 3:
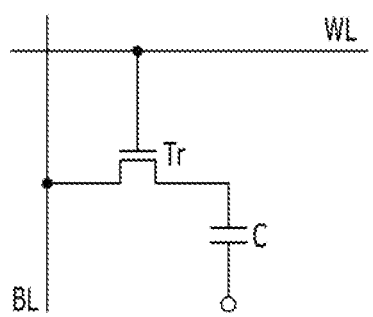
FIG. 3 is a circuit diagram illustrating a memory cell included in a MAT shown in FIG. 2.

FIG. 3 is a circuit diagram illustrating a memory cell included in the MAT 1111 shown in FIG. 2. Referring to FIG. 3, a memory cell may include a word line WL, a bit line BL, a capacitor C, and a transistor TR.

A memory is a storage device and comprises a storing part for storing data and a transferring part for transfer data from an external to the storing part and stored data from the storing part to the external. The transferring part may be referred to as a peripheral circuit and the storing part may be referred to as the cell array. The cell array is a collection of unit storage devices in the form of matrix. The memory cell as a unit storage device capable of storing 1 bit data as unit data may include a capacitor C capable of storing and retaining the unit data, a transistor TR, a word line WL for selecting and activating the memory cell and a bit line BL for inputting and outputting the unit data.

A plurality of memory cells form a MAT 111, a plurality of MATS, form a bank 1110, and a plurality of banks 1110 to 1140 form a memory cell array or the normal memory region 1100.

The cosmic ray detection circuit 1200 may include a plurality cosmic ray detection units correspond to the memory cells, the MATs or the banks 1110 to 1140 illustrated in FIGS. 2 and 3, respectively.

FIG. 3 shows a dynamic random access memory (DRAM) as an example and the embodiment of the present invention may be applied to other types of memory devices such as a static random access memory (SRAM), a flash memory and so forth.

Figure 4:
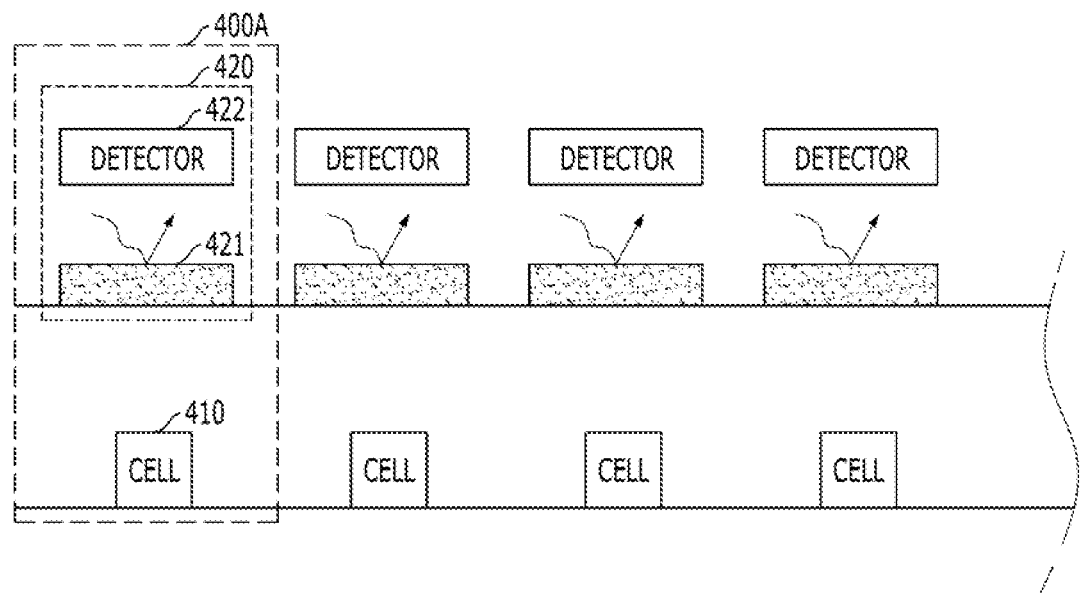
FIG. 4 is a diagram illustrating a plurality of cosmic ray detection units respectively corresponding to memory cells in the normal memory region shown in FIG. 1.

FIG. 4 is a diagram illustrating a plurality of cosmic ray detection units respectively corresponding to memory cells in the normal memory region 1100 shown in FIG. 1. Referring to FIG. 4, four cosmic ray detection units may be disposed to correspond to four memory cells. Description about a first block 400A including one cosmic ray detection unit 420 and one memory cell 410 will be made as an example.

The memory cell 410 may be disposed over a substrate. The cosmic ray detection unit 420 may include a crystal layer 421 and a detector 422.

The crystal layer 421 may reflect the cosmic ray to penetrate through the memory cell 410. The detector 422 may detect the cosmic ray reflected by the crystal layer 421.

Description about operation of the electronic device in accordance with an embodiment of the present invention will be made with reference to FIGS. 1 and 4.

Referring to FIGS. 1 and 4, the cosmic ray detection unit 420 may detect the cosmic ray and transmit the cosmic ray detection signal DTE_SIG to the controller 2000. The memory controller 2000 may output the first control signal COPY_CMD_A and the second control signal COPY_CMD_B in response to the cosmic ray detection signal DTE_SIG and copy data stored in each memory cell of the spare memory region 1300 as a basic unit. Therefore the data error of the normal memory region 1100 caused by the cosmic ray may be corrected.

FIG. 4 shows as an example that 4 memory cells of the normal memory region 1100 have respective data and a data error is corrected by copying data stored in each of memory cells of the spare memory region 1300 when the cosmic ray is detected. In accordance with another embodiment of the present invention, each pair of memory cells of the normal memory region 1100 have the same data, and when the cosmic ray is detected on one memory cell of the pair of memory cells, a data error is corrected by copying data stored in the other memory cell of the pair of memory cells.

Figure 5:
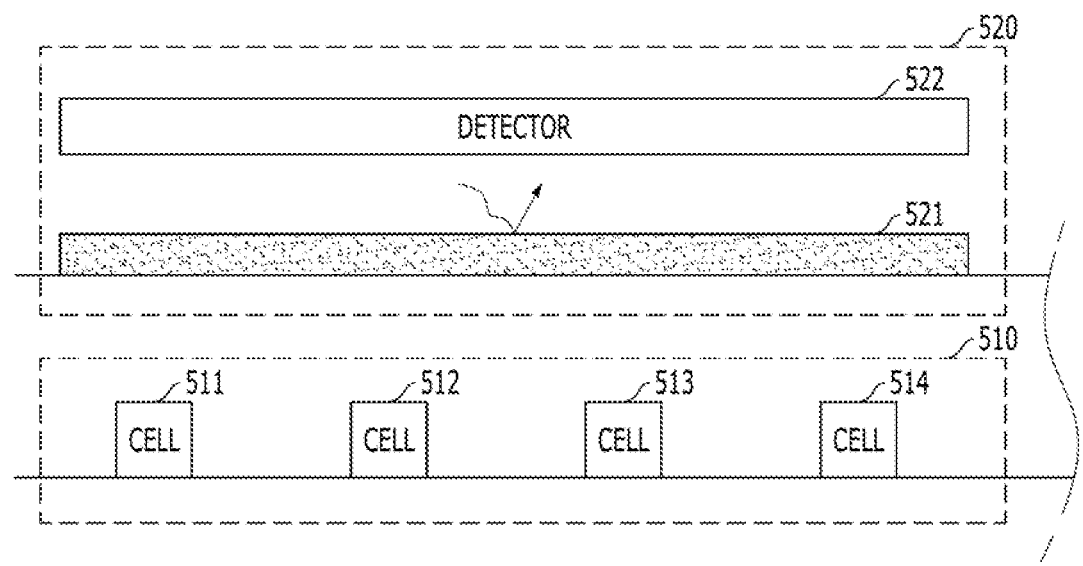
FIG. 5 is a diagram illustrating a cosmic ray detection unit corresponding to a MAT including a plurality of memory cells in the normal memory region shown in FIG. 1.

FIG. 5 is a diagram illustrating a cosmic ray detection unit corresponding to a MAT including a plurality of memory cells in the normal memory region shown in FIG. 1. Referring to FIG. 5, a MAT 510 including a plurality of memory cells 511 to 514 may be disposed over a substrate. The cosmic ray detection unit 520 may include a crystal layer 521 and a detector 522. The cosmic ray detection unit 520 may correspond to the MAT 510 including a plurality of memory cells 511 to 514.

FIG. 5 shows as an example the MAT 510 including a plurality of memory cells 511 to 514. In accordance with another embodiment of the present invention, a bank or the entire memory cell array may replace the MAT 510.

Description about operation of the electronic device in accordance with an embodiment of the present invention will be made with reference to FIGS. 1 and 5.

Referring to FIGS. 1 and 5, the crystal layer 521 may reflect the cosmic ray to penetrate through one or more of the plurality of memory cells 511 to 514 of the MAT 510. The detector 522 may detect the cosmic ray reflected by the crystal layer 521.

The cosmic ray detection unit 520 may detect the cosmic ray and transmit the cosmic ray detection signal DTE_SIG to the controller 2000. The memory controller 2000 may output the first control signal COPY_CMD_A and the second control signal COPY_CMD_B in response to the cosmic ray detection signal DTE_SIG and copy data stored in each MAT of the spare memory region 1300. Therefore the data error of the normal memory region 1100 caused by the cosmic ray may be corrected.

In accordance with another embodiment of the present invention, the cosmic ray detection circuit including a plurality of cosmic ray detection units may correspond to a bank or the entire memory cell array and the data copy may be performed with a bank Or a memory cell array as a basic unit.

Figure 6:
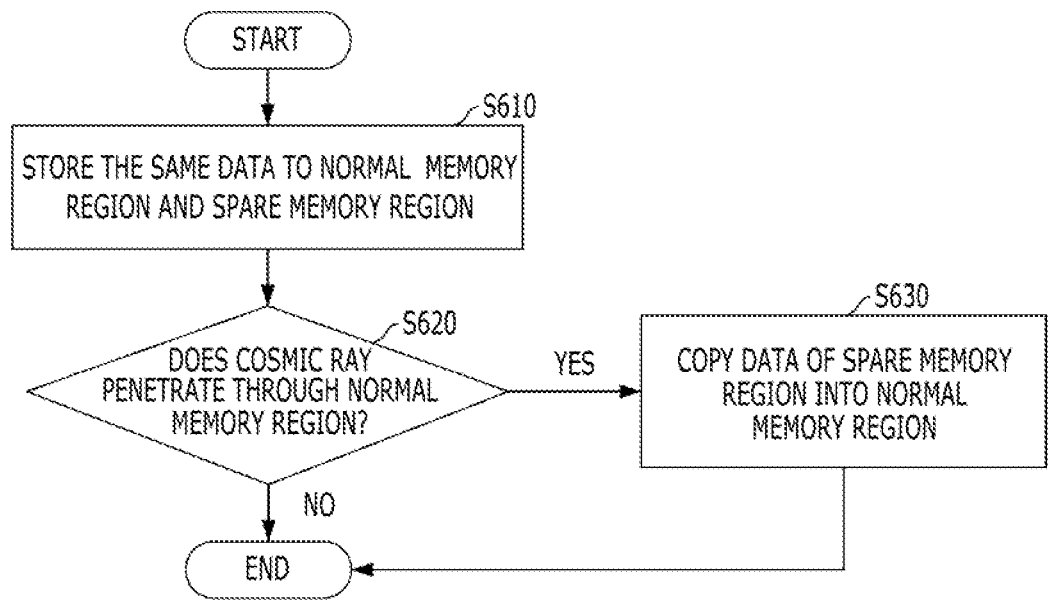
FIG. 6 is a flowchart illustrating a data error correction method in accordance with an embodiment of the present invention.

FIG. 6 is a flowchart illustrating a data error correction method ire accordance with an embodiment of the present invention.

Referring to FIGS. 1 and 6, in step S610, the normal memory region 1100 and the spare memory region 1300 may store the same data at a time of write operation.

In step S620, the cosmic ray detection circuit 1200 may check whether or not the cosmic ray penetrates through the normal memory region 1100. When the cosmic ray penetrates through the normal memory region 1100, step 630 may be performed.

In accordance with various embodiments of the present invention, the cosmic ray detection circuit 1200 may correspond to a memory cell, a MAT, a bank or a memory cell array, which will be described in detail.

When the cosmic ray penetrates through the normal memory region 1100, data stored in the spare memory region 1300 may be copied into the normal memory region 1100 under the control of the memory controller 2000 in step S630. The data copy for data error correction may be performed through the data bus 1400 coupling the normal memory region 1100 and the spare memory region 1300.

Description about operation of the cosmic ray detection circuit 1200 is made below in accordance with various embodiments of the present invention where the cosmic ray detection circuit 1200 may correspond to a memory cell, a MAT, a bank or a memory cell array.

In case of the cosmic ray detection circuit 1200 disposed over a memory cell in the normal memory region 1100, the cosmic ray detection circuit 1200 may detect the cosmic ray to penetrate through the memory cell (step S620) and transmit the cosmic ray detection signal DTE_SIG to the controller 2000. The memory controller 2000 may output the first control signal COPY_CMD_A and the second control signal COPY_CMD_B respectively to the normal memory region 1100 and the spare memory region 1300 in response to the cosmic ray detection signal DTE_SIG. Data stored in each memory cell of the spare memory region 1300 may be copied into the normal memory region 1100 with a memory cell as a basic unit (step S630). Therefore the data error of the normal memory region 1100 caused by the cosmic ray may be corrected.

In case of the cosmic ray detection circuit 1200 disposed over a MAT, a bank or a memory cell array in the normal memory region 1100, the cosmic ray detection circuit 1200 may detect the cosmic ray to penetrate through the MAT, the bank or the memory cell array (step S620) and transmit the cosmic ray detection signal DTE_SIG to the controller 2000. The memory controller 2000 may output the first control signal COPY_CMD_A and the second control signal COPY_CMD_B respectively to the normal memory region 1100 and the spare memory region 1300 in response to the cosmic ray detection signal DTE_SIG. Data stored in each MAT, each bank or each memory cell array of the spare memory region 1300 may be copied into the normal memory region 1100 with a MAT, a bank or a memory cell array as a basic unit (step S630). Therefore the data error of the normal memory region 1100 caused by the cosmic ray may be corrected.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
    a first memory region;
    a second memory region suitable for storing same data as the first memory region; and
    a ray detection circuit suitable for detecting an incident ray to the first memory region,
    wherein a data stored in the second memory region is copied into the first memory region when the incident ray is detected,
    wherein the ray detection circuit includes a plurality of ray detection units, and each of the plurality of ray detection units includes:
        a crystal layer disposed over the first memory region and suitable for reflecting the incident ray; and
        a detector for detecting a reflected ray reflected by the crystal layer.

2. The semiconductor memory device of claim 1, wherein the plurality of ray detection units are disposed over and corresponding to respective memory cells in the first memory region, and
    wherein a data stored in each memory cell of the second memory region is copied when the incident ray is detected.

3. The semiconductor memory device of claim 1, wherein the plurality of ray detection units are disposed over and corresponding to respective groups of memory cells in the first memory region, and
    wherein data stored in each group of memory cells of the second memory region is copied when the incident ray is detected.

4. The semiconductor memory device of claim 1, wherein the normal memory region is disposed over and corresponds to an entire memory cell array of the first memory region, and
    wherein data stored in an entire memory cell array of the second memory region is copied when the incident ray is detected.

5. The semiconductor memory device of claim 1, further comprising a data bus suitable for coupling the first memory region and the second memory region.

6. The semiconductor memory device of claim 1, wherein the incident ray includes a cosmic ray.

7. An electronic device comprising:
    a semiconductor device comprising first and second memory regions storing same data and suitable for generating a ray detection signal by detecting an incident ray to the first memory region;

a ray detection circuit suitable for detecting the incident ray to the first memory region and generating the ray detection signal; and a controller suitable for generating a control signal in response to the ray detection signal, wherein the semiconductor device copies a data stored in the second memory region into the first memory region in response to the control signal; and wherein the ray detection circuit includes a plurality of ray detection units, and each of the plurality of ray detection units includes:

a crystal layer disposed over the first memory region and suitable for reflecting the incident ray; and a detector for detecting a reflected ray reflected by the crystal layer.

8. The electronic device of claim 7, wherein the plurality of ray detection units are disposed over and corresponding to respective memory cells in the first memory region, and wherein the semiconductor device copies a data stored in each memory cell of the second memory region in response to the control signal.

9. The electronic device of claim 7, wherein the plurality of ray detection units are disposed over and corresponding to respective groups of memory cells in the first memory region, and wherein the semiconductor device copies data stored in each group of memory cells of the second memory region in response to the control signal.

10. The electronic device of claim 7, wherein the normal memory region is disposed over and corresponds to an entire memory cell array of the first memory region, and wherein the semiconductor device copies data stored in an entire memory cell array of the second memory region in response to the control signal.

11. The electronic device of claim 7, wherein the semiconductor memory device further includes a data bus coupling the first memory region and the second memory region.

* * * * *